United States Patent
Hwang et al.

(10) Patent No.: US 12,456,627 B2
(45) Date of Patent: Oct. 28, 2025

(54) DRY ETCHING APPARATUS AND WAFER ETCHING SYSTEM USING THE SAME

(71) Applicant: Samsung Electronics Co., Ltd., Suwon-si (KR)

(72) Inventors: Hyunsu Hwang, Siheung-si (KR); Suhyeon Ku, Asan-si (KR); Junyun Kweon, Cheonan-si (KR); Solji Song, Suwon-si (KR); Dongjoon Oh, Suwon-si (KR); Chungsun Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 600 days.

(21) Appl. No.: 17/883,778

(22) Filed: Aug. 9, 2022

(65) Prior Publication Data
US 2023/0104421 A1   Apr. 6, 2023

(30) Foreign Application Priority Data
Sep. 17, 2021 (KR) .......................... 10-2021-0125213

(51) Int. Cl.
*H01L 21/31* (2006.01)
*H01J 37/32* (2006.01)
*H01L 21/311* (2006.01)

(52) U.S. Cl.
CPC .. *H01L 21/31116* (2013.01); *H01J 37/32642* (2013.01); *H01J 2237/334* (2013.01)

(58) Field of Classification Search
CPC .............................................. H01J 37/32642
See application file for complete search history.

(56) References Cited

U.S. PATENT DOCUMENTS

| 6,481,723 | B1* | 11/2002 | Hao | ................. | H01L 21/68742 |
| | | | | | 279/155 |
| 9,034,771 | B1 | 5/2015 | Nangoy | | |
| 10,648,071 | B2 | 5/2020 | Johanson et al. | | |
| 10,651,015 | B2 | 5/2020 | Angelov et al. | | |
| 2009/0110847 | A1* | 4/2009 | Amelung | ............... | H10K 71/00 |
| | | | | | 427/569 |
| 2009/0209112 | A1* | 8/2009 | Koelmel | ........... | H01L 21/68735 |
| | | | | | 438/795 |

(Continued)

FOREIGN PATENT DOCUMENTS

| KR | 1020020088140 A | 11/2002 |
| KR | 1020090011617 U | 2/2009 |
| KR | 1020170095137 A | 8/2017 |

*Primary Examiner* — Keath T Chen
(74) *Attorney, Agent, or Firm* — Muir Patent Law, PLLC

(57) ABSTRACT

Provided is a dry etching apparatus including: a plasma process chamber; an edge ring which is arranged in the plasma process chamber and on which a wafer is mounted; a shadow ring positioned to be spaced apart by a first vertical distance above the edge ring during a plasma etching process of the wafer; an operation unit coupled to the shadow ring and having a lift pin that raises and lowers the shadow ring; a fixing portion having a plurality of fixing pins engaged with the lift pin at different positions to fix a lowering point of the shadow ring; and a distance control unit that controls the fixing portion to determine the first vertical distance, wherein the first vertical distance is determined by a first horizontal distance between the wafer and the edge ring.

20 Claims, 13 Drawing Sheets

(56) References Cited

U.S. PATENT DOCUMENTS

| | | |
|---|---|---|
| 2018/0047645 A1* | 2/2018 | Varadarajan ...... H01L 21/67207 |
| 2020/0219706 A1 | 7/2020 | Koshimizu |
| 2021/0066052 A1 | 3/2021 | Emura |
| 2021/0166920 A1 | 6/2021 | Koshimizu et al. |

* cited by examiner

DRY ETCHING APPARATUS AND WAFER ETCHING SYSTEM USING THE SAME

CROSS-REFERENCE TO RELATED APPLICATION

This application is based on and claims priority under 35 U.S.C. § 119 to Korean Patent Application No. 10-2021-0125213, filed on Sep. 17, 2021, in the Korean Intellectual Property Office, the disclosure of which is incorporated by reference herein in its entirety.

BACKGROUND

The inventive concept relates to a dry etching apparatus and a wafer etching system using the dry etching apparatus, and more particularly, to a dry etching apparatus capable of preventing damage to an edge portion of a wafer due to excessive plasma, and a wafer etching system using the dry etching apparatus.

In a process of manufacturing a semiconductor device, an etching process of etching a target layer on a wafer in a certain pattern is necessary. The etching process includes a dry etching process and a wet etching process, and a plasma etching process is a type of the dry etching process. The plasma etching process has a feature of etching a layer to be etched on a wafer by using plasma generated by injecting a process gas into a process chamber through a shower head in a dry etching apparatus. However, the edge portion of the wafer may be damaged by excessive plasma.

SUMMARY

The inventive concept provides a dry etching apparatus capable of preventing an edge portion of a wafer from being damaged due to excessive plasma.

The inventive concept provides a wafer etching system capable of preventing an edge portion of a wafer from being damaged due to excessive plasma.

The objective to be achieved by the inventive concept is not limited to the objectives described above, and other objectives not described will be clearly understood by a person of ordinary skill in the art from the following description.

According to an aspect of the inventive concept, there is provided a dry etching apparatus including plasma process chamber, an edge ring which is arranged in the plasma process chamber and on which a wafer is mounted, a shadow ring positioned to be spaced apart by a first vertical distance on the edge ring during a plasma etching process of the wafer, an operation unit coupled to the shadow ring and having a lift pin that raises and lowers the shadow ring, a fixing portion having a plurality of fixing pins engaged with the lift pin at different positions to fix a lowering point of the shadow ring, and a distance control unit configured to control the fixing portion to determine the first vertical distance, wherein the first vertical distance is determined by a first horizontal distance between the wafer and the edge ring.

According to an aspect of the inventive concept, there is provided a wafer etching system including an edge ring on which a wafer is mounted, a shadow ring positioned on an upper portion of the edge ring, an operation unit having a lift pin that raises and lowers the shadow ring, a fixing portion having a plurality of fixing pins that are engaged with the lift pin to fix a lowering point of the shadow ring, and a distance control unit configured to control the fixing portion to adjust the lowering point of the shadow ring, wherein the distance control unit determines a first vertical distance between the edge ring and the shadow ring according to a first horizontal distance between the wafer and the edge ring.

According to an aspect of the inventive concept, there is provided a dry etching method including loading a wafer into a process chamber, mounting the wafer on an edge ring, transferring a first horizontal distance between the wafer and the edge ring to a distance control unit, positioning a shadow ring to be spaced apart by a first vertical distance on an upper portion of the edge ring, dry etching the wafer by using plasma, raising the shadow ring, and unloading the wafer to an outside of the process chamber, wherein the first vertical distance is determined by the first horizontal distance.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept are described in detail with reference to the accompanying drawings. Like numerals refer to like elements throughout.

Figure 1:
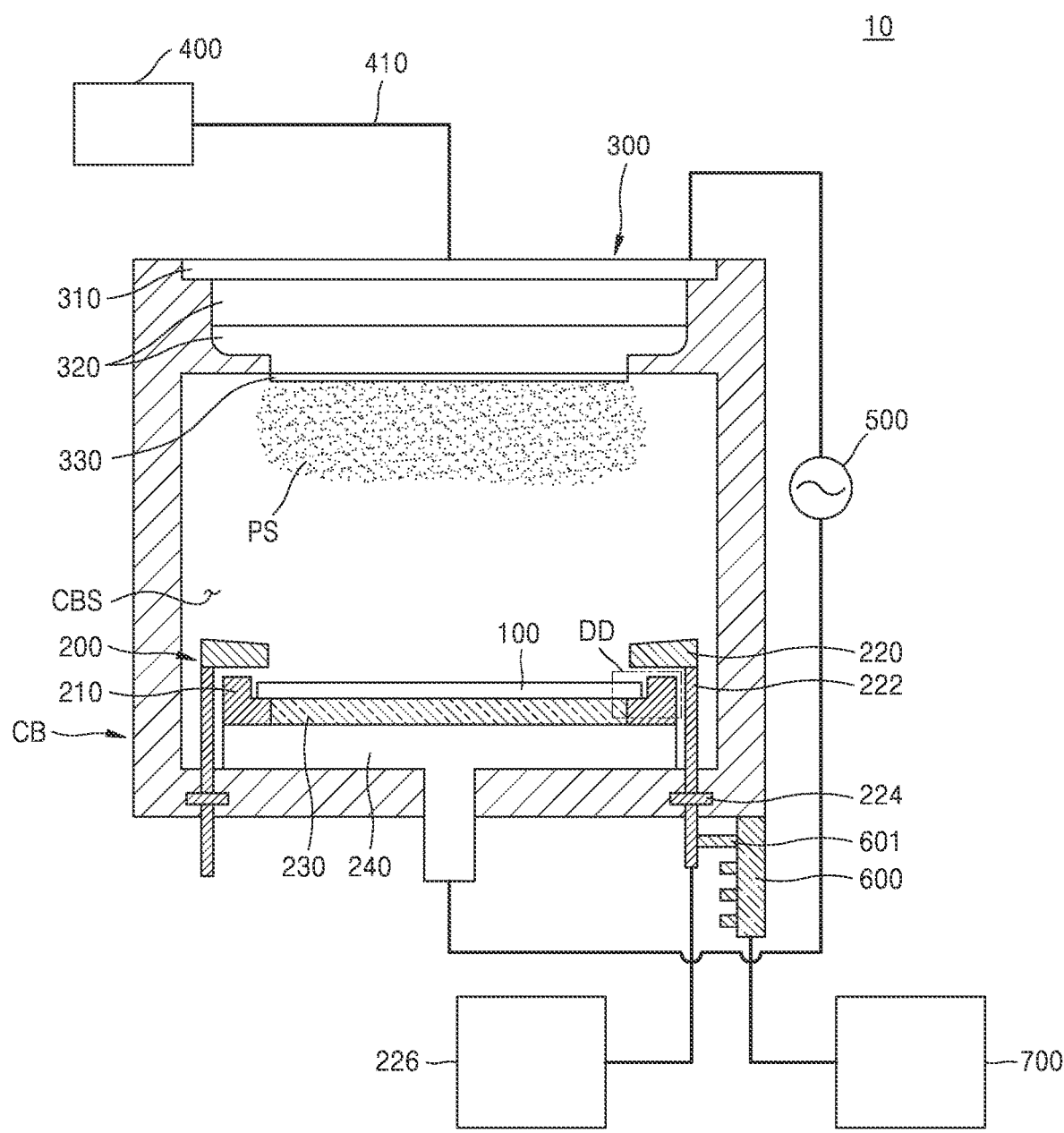
FIG. 1 is a schematic diagram illustrating a dry etching apparatus, according to an example embodiment of the inventive concept.
Figure 2:
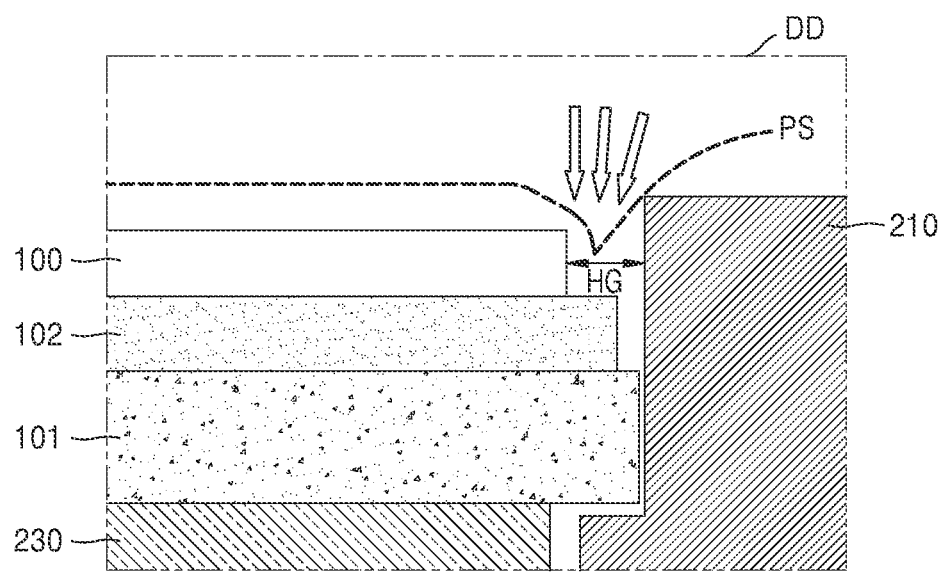
FIG. 2 is an enlarged cross-sectional view illustrating a region DD of FIG. 1.
Figure 3:
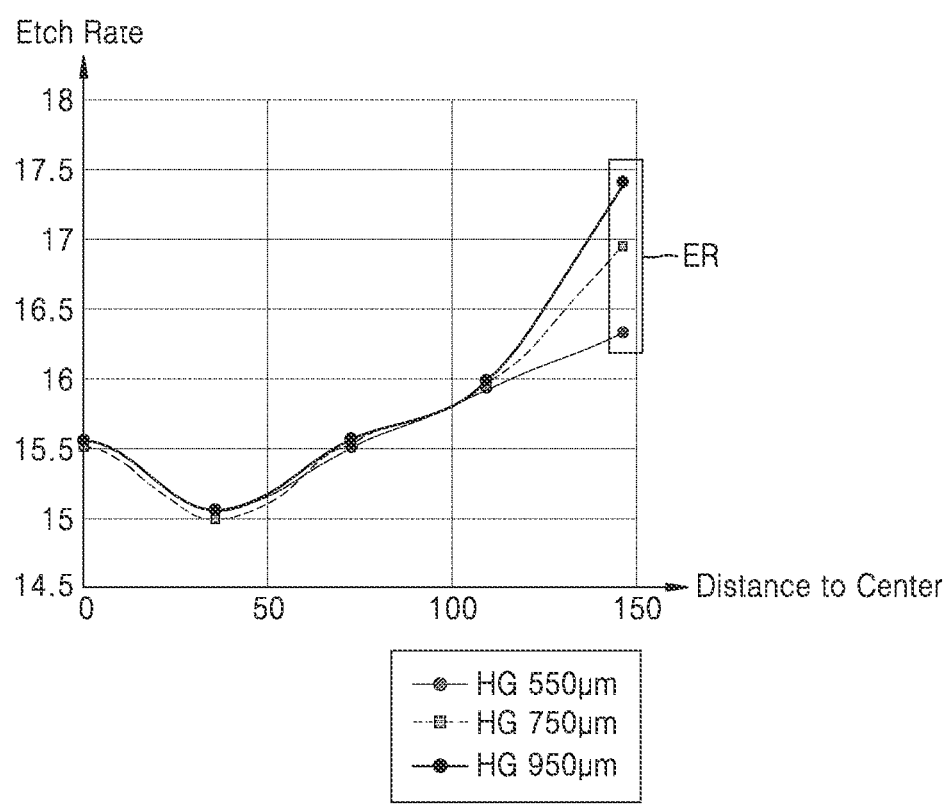
FIG. 3 is a graph showing a first etching rate according to a first horizontal distance in the dry etching apparatus of FIG. 1.
Figure 4:
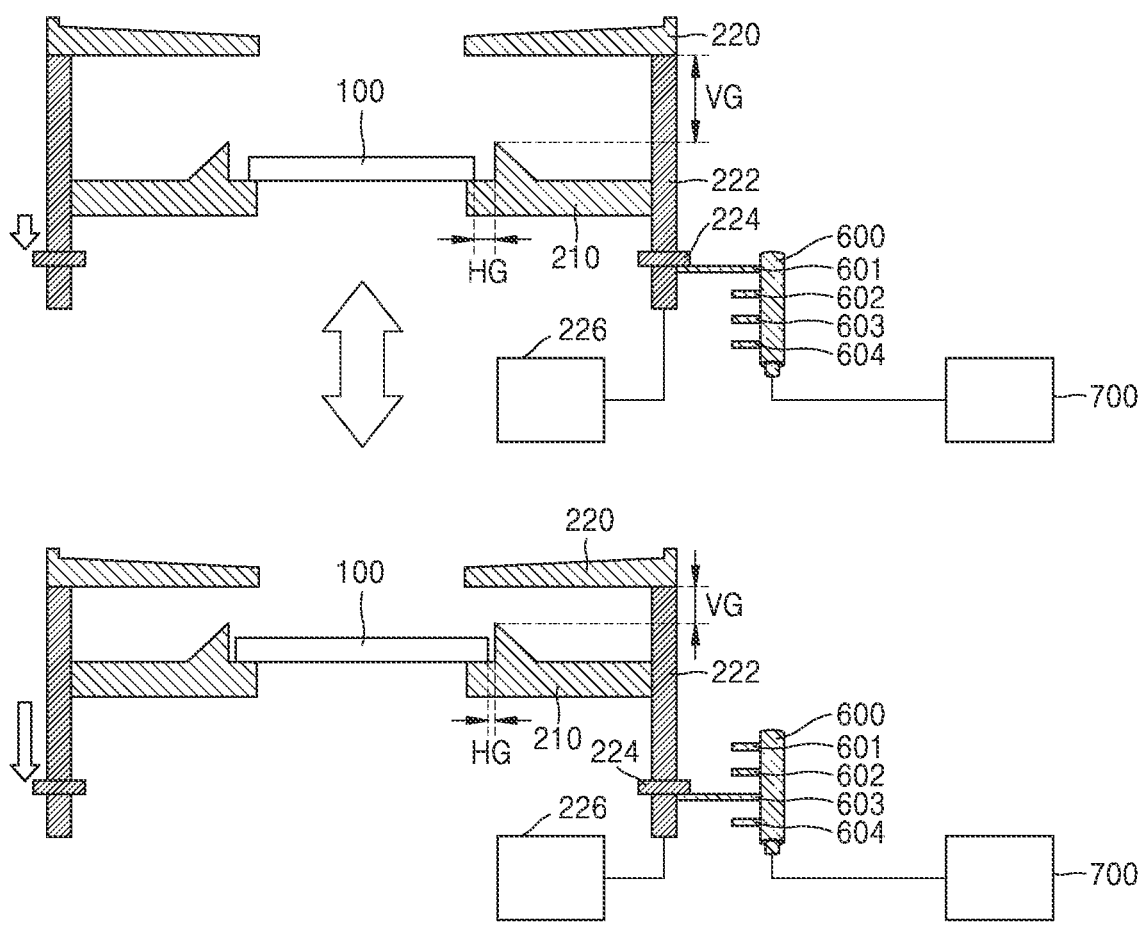
FIG. 4 is a diagram illustrating a characteristic in which a shadow ring is raised and lowered in the dry etching apparatus of FIG. 1.

FIG. 1 is a schematic diagram illustrating a dry etching apparatus according to an example embodiment of the inventive concept, FIG. 2 is an enlarged cross-sectional view illustrating a region DD of FIG. 1, FIG. 3 is a graph showing a first etching rate according to a first horizontal distance in the dry etching apparatus of FIG. 1, and FIG. 4 is a diagram illustrating a characteristic in which a shadow ring is raised and lowered in the dry etching apparatus of FIG. 1.

Referring to FIGS. 1 to 4 together, a dry etching apparatus 10 may include a process chamber CB, a wafer support unit 200 arranged under the process chamber CB to support a wafer 100, and a gas supply unit 300 arranged above the process chamber CB to supply a process gas.

The process chamber CB has an internal space CBS having a certain size and may include a material having excellent wear resistance and corrosion resistance. The process chamber CB may be referred to as a chamber housing. For example, the process chamber CB may include an aluminum block. The process chamber CB may maintain the internal space CBS in a closed state or a vacuum state in a plasma processing process (e.g., an etching process using plasma). The process chamber CB may include part of the dry etching apparatus 10 including a plurality of chambers.

The wafer support unit 200 may be arranged below the internal space CBS of the process chamber CB. The wafer support unit 200 may include an edge ring 210, a shadow ring 220, a support 230, and a lower electrode 240. The wafer 100 to be processed may be arranged over the edge ring 210 and an upper surface of the support 230.

The wafer support unit 200 may fix and support the wafer 100 during an etching process. The wafer support unit 200 may be configured by a combination of a conductive material and an insulating material, and may include a conductive portion capable of receiving an electrostatic force from an electrostatic force source (not shown) and a polarized concave-convex protrusion.

When an electrostatic force is applied between the wafer 100 and the support 230 by using a bipolar electrostatic force supplied from the electrostatic force source, the wafer 100 may be stably fixed to the support 230 while the etching process is in progress. The concave-convex protrusion may be arranged on the support 230 and the wafer 100 may be fixed by a bipolar electrostatic force. However, the wafer support unit 200 is not limited to the manner described above, and for example, the wafer support unit 200 may fix the wafer 100 in various ways such as mechanical clamping.

The wafer 100 to be processed may be arranged to be spaced apart from the edge ring 210 by a certain distance, that is, a first horizontal distance HG. This may be a characteristic due to a type of semiconductor device provided on the wafer 100.

The shadow ring 220 may be arranged to be spaced apart from the edge ring 210 by a certain distance so as to cover an edge portion of the wafer 100. A lift pin 222 may be arranged at a lower portion of the shadow ring 220 to raise and lower the shadow ring 220. A portion of the lift pin 222 may include a pin protrusion 224 protruding to the outside. In addition, an operation unit 226 for providing power to raise and lower the shadow ring 220 may be connected to the lift pin 222. The operation unit 226 may include an actuator.

In some embodiments, each of the edge ring 210 and the shadow ring 220 may include an insulating material. For example, each of the edge ring 210 and the shadow ring 220 may include a ceramic material, but embodiments are not limited thereto. Detailed features of an operation of the wafer support unit 200 are described below.

The gas supply unit 300 may include an upper electrode 310, a gas distribution plate 320, and a shower head 330. The gas supply unit 300 may be arranged to be spaced apart from the wafer support unit 200 by a certain distance at a position facing the wafer support unit 200, and arranged above the process chamber CB. The gas supply unit 300 may be connected to a gas supply source 400 through a gas supply pipe 410, and the gas supply source 400 may supply a process gas to the internal space CBS through the gas supply unit 300.

The gas supply source 400 may be connected to the gas supply unit 300 through the gas supply pipe 410. The gas supply pipe 410 may supply a process gas from the gas supply source 400 to the gas supply unit 300 and may include a valve (not shown) for switching a gas flow on or off. For example, the process gas may include a fluorine (F)-based gas, an inert gas, and the like, but is not limited thereto.

The gas supply source 400 may be controlled by a gas controller (not shown). In other words, by controlling the gas supply source 400, the gas controller may control a type of gas supplied to the gas supply unit 300, a supply point/end point of the gas, a flow rate of the gas, and the like.

A power supply unit 500 may be connected to the upper electrode 310 of the gas supply unit 300 and the lower electrode 240 of the wafer support unit 200, and plasma PS may be generated in the internal space CBS between the gas supply unit 300 and the wafer support unit 200 by using a power supplied to the power supply unit 500.

For example, the power supply unit 500 may apply a high frequency power of about 60 MHz through the upper electrode 310 of the gas supply unit 300 and may apply a high frequency power of about 2 MHz through the lower electrode 240 of the wafer support unit 200 arranged to face the gas supply unit 300.

Briefly describing a process of generating the plasma PS, a process gas may be supplied from the gas supply source 400 arranged outside of the process chamber CB to the internal space CBS through the gas supply unit 300, and electric power generated by the power supply unit 500 may convert the process gas into the plasma PS. Accordingly, the plasma PS may be injected to the wafer 100 on the wafer support unit 200 arranged under the internal space CBS.

The plasma PS may include ions and/or radicals (hereinafter, collectively referred to as ions) of a process gas and serve as a plasma PS for etching for etching a layer to be etched provided on the wafer 100. The gas supply unit 300 may form a plasma sheath having a uniform density on the upper portion of the wafer 100 by inducing the ions to be distributed at a uniform density in an upper space of the wafer 100. Accordingly, a uniform etching process may be performed over a whole surface of the wafer 100.

The dry etching apparatus 10 according to the inventive concept may further include a fixing portion 600 for fixing the shadow ring 220 to a desired position while the plasma etching process of the wafer 100 is in progress, as well as the above-described elements. The fixing portion 600 may include a plurality of fixing pins 601, 602, 603, and 604 arranged at different vertical positions at the same distance from each other. In the drawings, the plurality of fixing pins 601, 602, 603, and 604 are illustrated as four, but the inventive concept is not limited thereto. The number of fixing pins may be greater or fewer than that illustrated.

Each of the plurality of fixing pins 601, 602, 603, and 604 may move between an operating position that engages the pin protrusion 224 to restrict raising and lowering of the lift pin 222 and a standby position spaced apart from the pin protrusion 224. When any of the plurality of fixing pins 601, 602, 603, and 604 is engaged with the pin protrusion 224, a position in a vertical direction of the lift pin 222 and a position in a vertical direction of the shadow ring 220 supported by the lift pin 222 may be determined.

In addition, the dry etching apparatus 10 according to the inventive concept may further include a distance control unit 700 capable of controlling the fixing portion to adjust a first vertical distance VG between the edge ring 210 and the shadow ring 220 to a desired position as well as the above-described elements.

The wafer 100 to be processed by the dry etching apparatus 10 may have an active surface on which a semiconductor device is provided and an inactive surface facing the active surface. The active surface corresponds to a front-side surface of the wafer 100, and the inactive surface corresponds to a back-side surface of the wafer 100. In addition, the wafer 100 may include a wafer and a material layer for device formation provided on the active surface of the wafer. A carrier substrate 101 may be adhered onto the active surface of the wafer 100, and a protective sheet 102 may be provided as an adhesive layer between the carrier substrate 101 and the wafer 100.

In general, the dry etching process using the plasma PS has a feature of anisotropically etching the layer to be etched on the wafer or the wafer 100 itself by using the plasma PS generated by injecting a process gas into the internal space CBS of the process chamber CB through the gas supply unit 300. However, the plasma PS etches not only a material layer to be etched on the wafer 100 or the wafer 100 itself, but also the edge portion of the wafer 100, resulting in unwanted overetching.

To resolve this, in the dry etching apparatus 10 according to the inventive concept, the shadow ring 220 may be arranged to be spaced apart by the first vertical distance VG on the edge ring 210 during a plasma PS etching process of the edge ring 210 on which the wafer 100 is mounted and the wafer 100, thereby reducing the unwanted overetching.

For example, as shown, by allowing the pin protrusion 224 to engage a first fixing pin 601, the first vertical distance VG may be adjusted to be relatively large. In some embodiments, by allowing the pin protrusion 224 to engage with a third fixing pin 603, the first vertical distance VG may be adjusted to be relatively small. This series of operations may be adjusted by the distance control unit 700.

Here, the first vertical distance VG may be determined by the first horizontal distance HG between the wafer 100 and the edge ring 210. In other words, a trim width of an edge portion of the wafer 100 may be determined according to a type of semiconductor device provided on the wafer 100, and the first horizontal distance HG may be determined according to the trim width.

For example, the first horizontal distance HG may be in a range of about 150 μm to about 1000 μm. In addition, the first vertical distance VG may increase in proportion to the first horizontal distance HG, and the first vertical distance VG may be in a range of about 0.1 mm to about 11 mm. However, the first horizontal distance HG and the first vertical distance VG are not limited to the above numerical values.

In addition, in the plasma etching process of the wafer 100, an edge portion of the wafer 100 (a position corresponding to a distance of 150 from the center in FIG. 3) may be etched at a first etching rate ER, and the inventors have found that the first etching rate ER may be directly proportional to the first horizontal distance HG. As described above, because the first horizontal distance HG is a value already determined according to the type of semiconductor device provided on the wafer 100, it is substantially difficult to adjust the first horizontal distance HG in order to control the first etching rate ER.

Accordingly, the inventors adopted a method of adjusting the first vertical distance VG in order to adjust the first etching rate ER. Under suitable conditions, the inventors have found that the first etching rate ER may be inversely proportional to the first vertical distance VG. In other words, the first etching rate ER may be adjusted by reducing the first vertical distance VG to increase the first etching rate ER or, conversely, by increasing the first vertical distance VG to reduce the first etching rate ER.

In this way, the dry etching apparatus 10 according to the inventive concept may effectively resolve a problem in which the edge portion of the wafer 100 is damaged by excessive plasma PS by adjusting the first vertical distance VG between the edge ring 210 and the shadow ring 220. Through this, ultimately, the reliability and productivity of the dry etching apparatus 10 may be increased.

Figure 5:
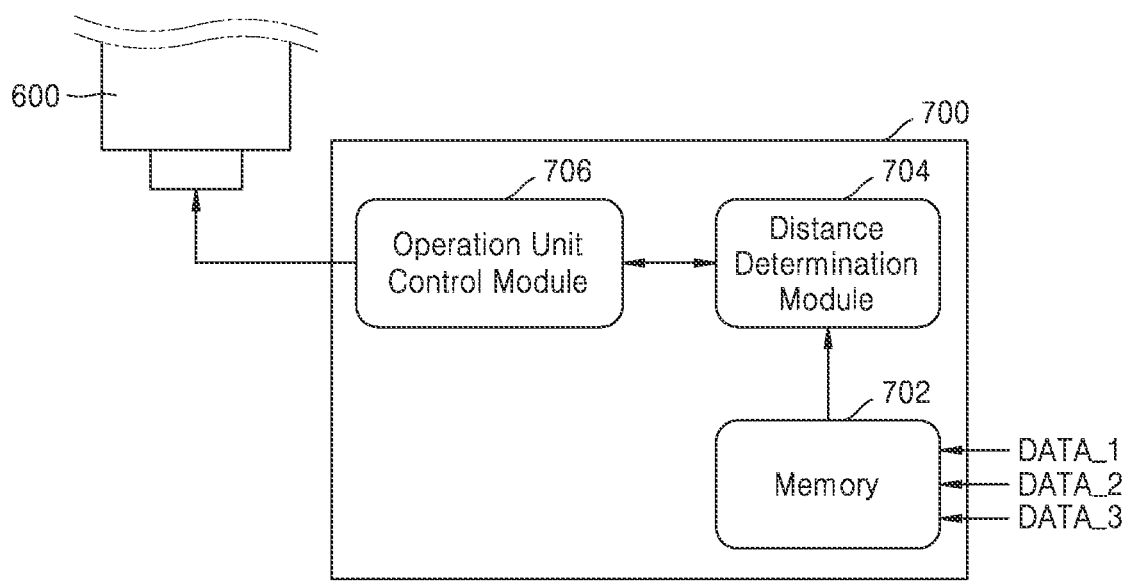
FIG. 5 is a block diagram of a configuration of a distance control unit, according to an example embodiment of the inventive concept.

FIG. 5 is a block diagram of a configuration of a distance control unit according to an example embodiment of the inventive concept.

Referring to FIG. 5, the distance control unit 700 may include a memory unit 702, a distance determination module 704, and an operation unit control module 706.

In example embodiments, the distance control unit 700 may be a computer (or several interconnected computers) and can include, for example, one or more processors configured by software, such as a CPU (Central Processing Unit), GPU (graphics processor), controller, etc., and include a distance determination module 704, and an operation unit control module 706, and the like, forming various functional modules of the computer. The computer may be a general purpose computer or may be dedicated hardware or firmware (e.g., an electronic or optical circuit, such as application-specific hardware, such as, for example, a digital signal processor (DSP) or a field-programmable gate array (FPGA)). A computer may be configured from several interconnected computers. Each functional module (or unit) described herein may comprise a separate computer, or some or all of the functional modules (or units) may be comprised of and share the hardware of the same computer. Connections and interactions between the units described herein may be hardwired and/or in the form of data (e.g., as data stored in and retrieved from memory of the computer, such as a register, buffer, cache, storage drive, etc., such as part of an application programming interface (API)). The functional modules (or units) of distance control unit 700 may each correspond to a separate segment or segments of software (e.g., a subroutine) which configure the computer of the distance control unit 700, and/or may correspond to segment(s) of software that also correspond to one or more other functional modules (or units) described herein (e.g., the functional modules (or units) may share certain segment(s) of software or be embodied by the same segment(s) of software). As is understood, "software" refers to prescribed rules to operate a computer, such as code or script. Memory unit 702 may comprise conventional memory of a computer, such as a hard drive (which may be a solid state drive, DRAM, NAND flash memory, etc.).

Figure 11:
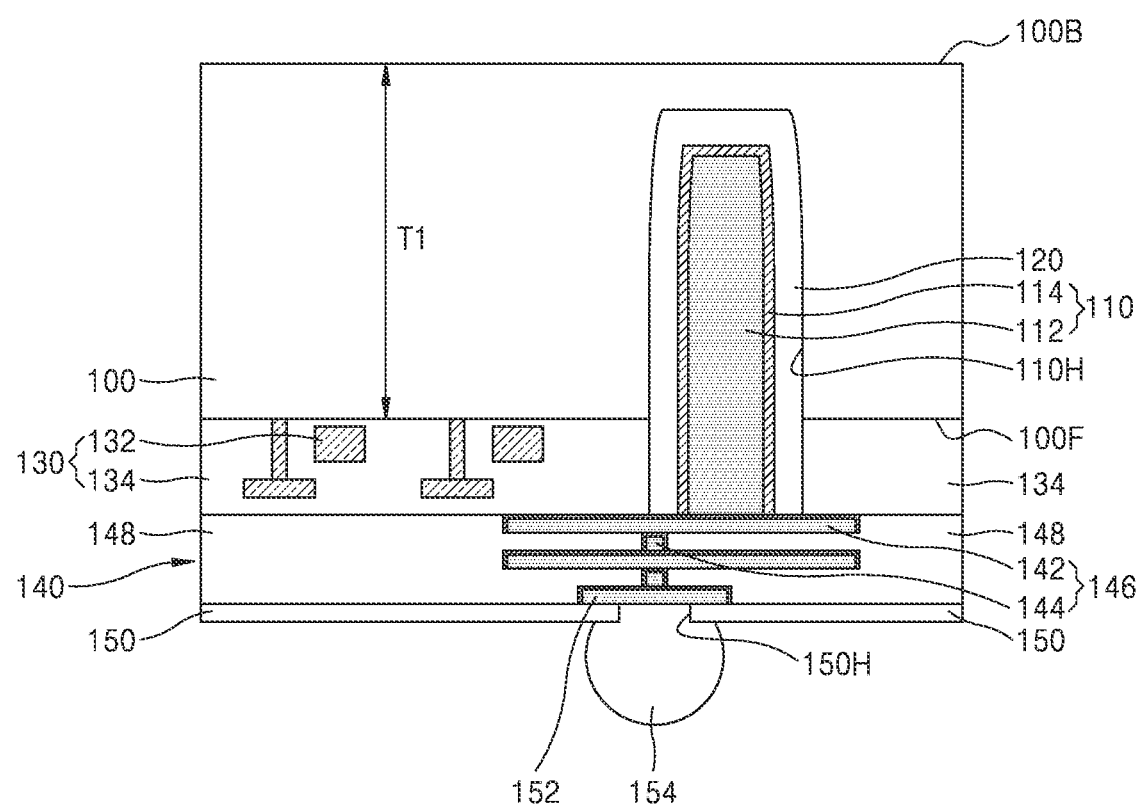
Figure 12:
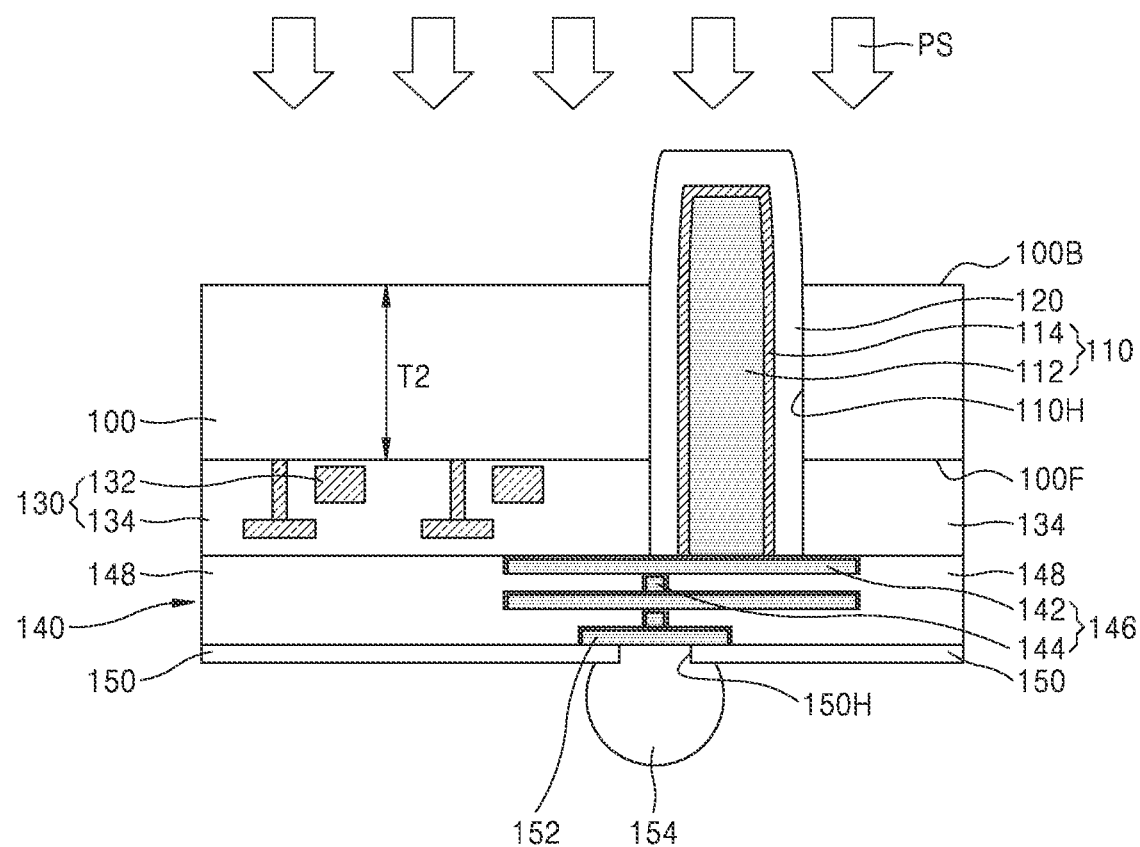

The distance control unit 700 may include the memory unit 702 capable of storing first data DATA_1 on a first thickness T1 (see FIG. 11) before an etching process of the wafer 100 (see FIG. 11) and second data DATA_2 on a second thickness T2 (see FIG. 12) after the etching process of the wafer 100 (see FIG. 12). In addition, the distance control unit 700 may generate feedback information about the etching process of the wafer 100 (see FIG. 1) according to the first data DATA_1 and the second data DATA_2.

In addition, the distance control unit 700 may include the distance determination module 704 configured to analyze the first horizontal distance HG (see FIG. 2) according to third data DATA_3 on a trim width of the wafer 100 (see FIG. 1) and determine the first vertical distance VG (see FIG. 4).

In addition, the distance control unit 700 may select any of the plurality of fixing pins 601, 602, 603, and 604 (see FIG. 4) of the fixing portion 600 according to the first vertical distance VG (see FIG. 4) determined by the distance determination module 704, and adjust the raising and lowering of the shadow ring 220 (see FIG. 1) through the operation unit control module 706. For example, the operation unit control module 706 may control an actuator to adjust the raising and lowering of the shadow ring 220.

In other words, the distance control unit 700 of the inventive concept may reduce the first vertical distance VG (see FIG. 4) through organic interlocking of the memory unit 702, the distance determination module 704, and the operation unit control module 706 in order to increase the first etching rate ER (see FIG. 3), or conversely, may adjust the first etching rate ER (see FIG. 3) to increase the first vertical distance VG (see FIG. 4) in order to reduce the first etching rate ER (see FIG. 3).

Figure 6:
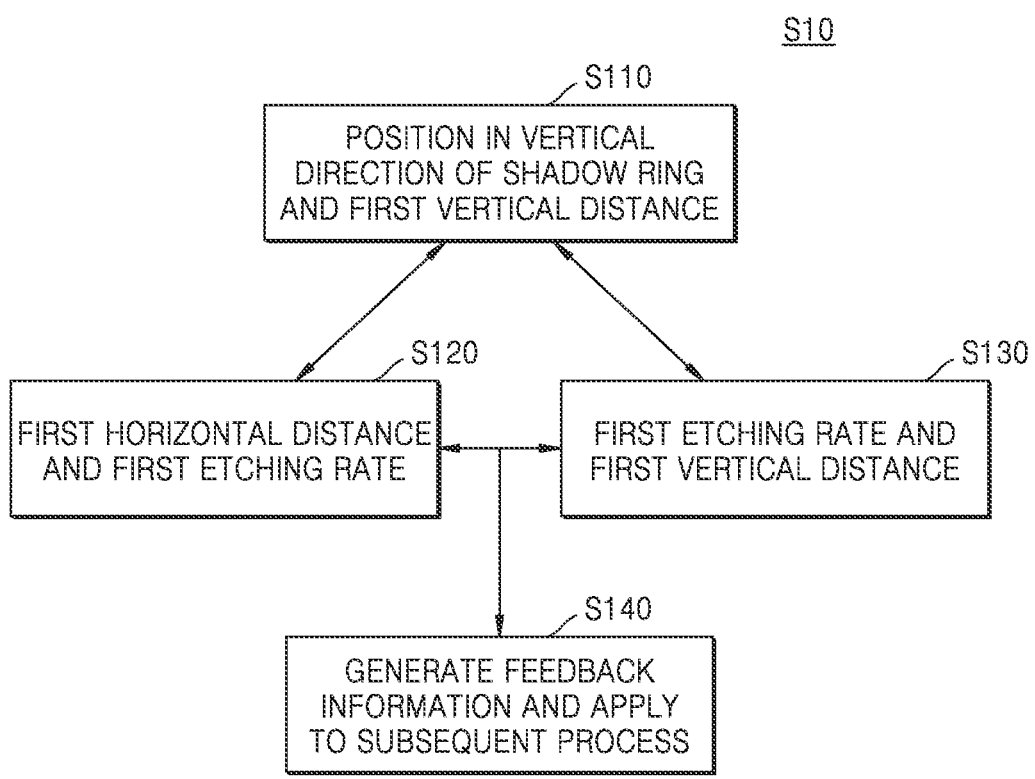
FIG. 6 is a flowchart of a wafer etching system, according to an example embodiment of the inventive concept.

FIG. 6 is a flowchart of a wafer etching system according to an example embodiment of the inventive concept.

Referring to FIG. 6, the wafer etching system S10 may include first to fourth operating conditions S110 to S140 to determine a position in a vertical direction of a shadow ring.

The wafer etching system S10 according to the inventive concept may be operated based on an algorithm including the first to fourth operating conditions S110 to S140 described below.

Operating Condition 1 (S110):
In a plasma dry etching process of the wafer 100 (see FIG. 1), a position in the vertical direction of the shadow ring may be proportional to the first vertical distance VG (see FIG. 4).

Operating Condition 2 (S120):
In the plasma dry etching process of the wafer 100 (see FIG. 1), an edge portion of the wafer 100 (see FIG. 1) may be etched at the first etching rate ER (see FIG. 3), and the first horizontal distance HG (see FIG. 2) may be proportional to the first etching rate ER (see FIG. 3).

Operating Condition 3 (S130):
In the plasma dry etching process of the wafer 100 (see FIG. 1), the first vertical distance VG (see FIG. 4) may be increased to relatively reduce the first etching rate ER (see FIG. 3), or the first vertical distance VG (see FIG. 4) may be reduced to relatively increase the first etching rate ER (see FIG. 3).

Operating Condition 4 (S140):
Feedback information about the plasma dry etching process of the wafer 100 (see FIG. 1) may be generated and applied to a subsequent plasma dry etching process.

The wafer etching system S10 according to the inventive concept may store information according to the first to fourth operating conditions S110 to S140 in the memory unit 702 (see FIG. 5) included in the distance control unit 700 (see FIG. 5).

In the wafer etching system S10 according to the inventive concept, a trim width of an edge portion of the wafer 100 (see FIG. 1) may be determined according to a type of semiconductor device provided on the wafer 100 (see FIG. 1), and the first horizontal distance HG (see FIG. 2) may be determined according to the trim width.

Figure 7:
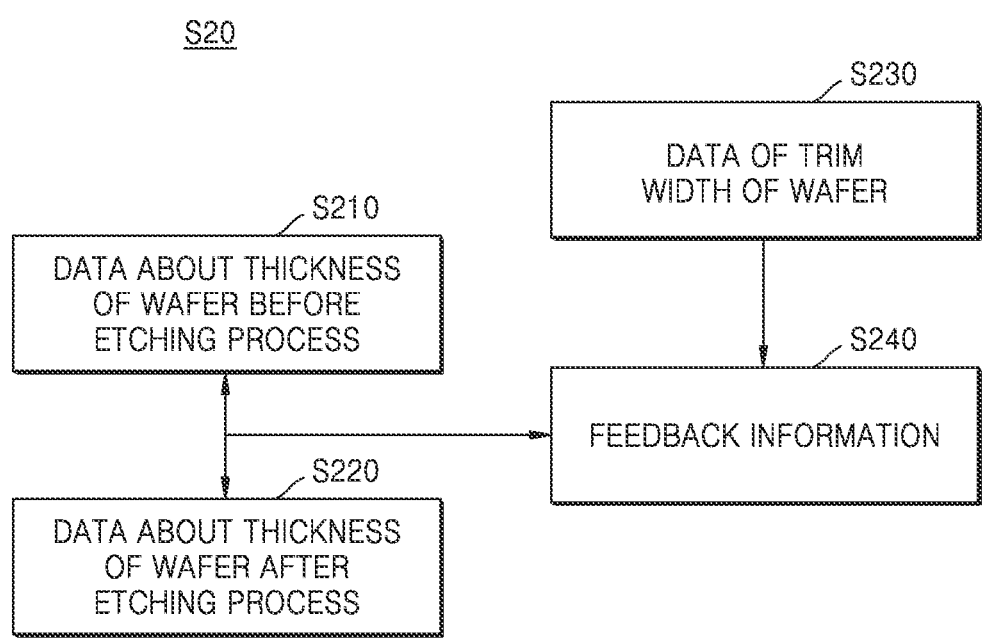
FIG. 7 is a flowchart of a feedback process of a wafer etching system, according to an example embodiment of the inventive concept.

FIG. 7 is a flowchart of a feedback process of a wafer etching system according to an example embodiment of the inventive concept.

Referring to FIG. 7, a feedback process S20 of the wafer etching system may be performed based on first to third data S210 to S240 described below.

During the feedback process S20 according to the inventive concept, the distance control unit 700 (see FIG. 5) may include the memory unit 702 (see FIG. 5) capable of storing the first data S210 about a first thickness of the wafer 100 (see FIG. 1) before the plasma dry etching process and storing the second data S220 about a second thickness of the wafer 100 (see FIG. 1) after the etching process.

Through this analysis, the distance control unit 700 (see FIG. 5) may generate feedback information S240 on the plasma dry etching process of the wafer 100 (see FIG. 1) according to the first data S210 for the first thickness and the second data S220 for the second thickness.

Using the feedback information S240, the distance control unit 700 (see FIG. 5) may analyze the first horizontal distance HG (see FIG. 2) according to the third data S230 of the trim width of the wafer 100 (see FIG. 1) and select any of the plurality of fixing pins 601, 602, 603, and 604 (see FIG. 4) to adjust the first vertical distance VG (see FIG. 4) through the operation unit control module 706 (see FIG. 5).

In other words, the distance control unit 700 may control the first etching rate ER (see FIG. 3) more effectively by adding the feedback information S240 to the third data S230 of an initial trim width. The distance control unit 700 (see FIG. 5) may control, by using the operation unit control module 706, the fixing portion 600 (see FIG. 5) to reduce the first vertical distance VG (see FIG. 4) to increase the first etching rate ER (see FIG. 3), or, conversely, to increase the first vertical distance VG (see FIG. 4) to reduce the first etching rate ER (see FIG. 3). In addition, the distance control unit 700 (see FIG. 5) may reset the first vertical distance VG (see FIG. 4) based on the feedback information S240.

In addition, the distance control unit 700 (see FIG. 5) may determine, for example, a time point of performing prevent maintenance on the dry etching apparatus 10 (see FIG. 1) by accumulating and analyzing data about a difference between the second thickness and the first thickness.

Figure 8:
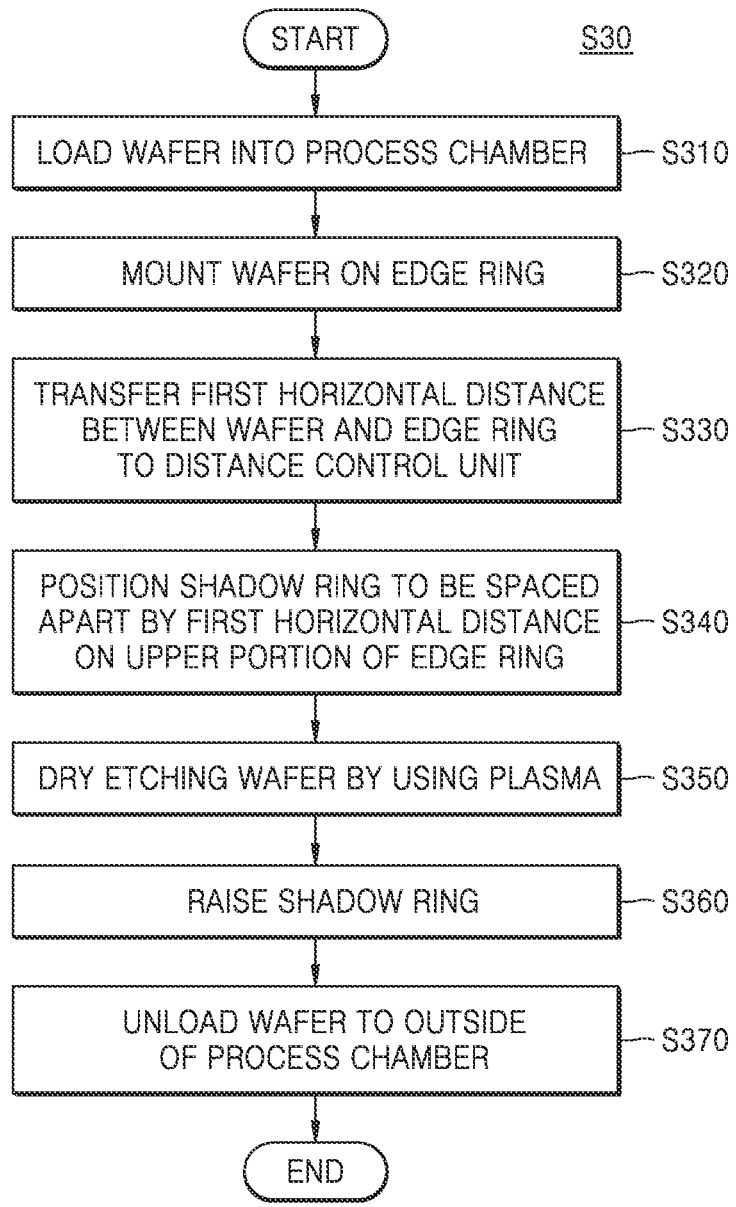
FIG. 8 is a flowchart of a dry etching method, according to an example embodiment of the inventive concept.

FIG. 8 is a flowchart of a dry etching method according to an example embodiment of the inventive concept.

Referring to FIG. 8, the dry etching method S30 may include a process sequence of first to seventh operations S310 to S370.

When an embodiment may be implemented differently, a certain process order may be performed differently from the described order. For example, two processes described in succession may be performed substantially simultaneously, or may be performed in an order opposite to that described.

The dry etching method S30 according to the inventive concept may include a first operation S310 of loading a wafer into a process chamber, a second operation S320 of mounting the wafer on an edge ring, a third operation S330 of transferring a first vertical distance between the wafer and the edge ring to a distance control unit, a fourth operation S340 of positioning a shadow ring to be spaced apart by a first vertical distance on an upper portion of the edge ring, a fifth operation S350 of dry etching the wafer by using plasma, a sixth operation S360 of raising the shadow ring, and a seventh operation S370 of unloading the wafer to the outside of the process chamber.

In addition, in the dry etching method S30 according to the inventive concept, the first vertical distance may be determined by the first horizontal distance.

The technical features of each of the first to seventh operations S310 to S370 are described in detail with reference to FIGS. 9 to 13 to be described below.

FIGS. 9 to 13 are diagrams illustrating a method of manufacturing a semiconductor package by using a dry etching apparatus, according to an example embodiment of the inventive concept.

Figure 9:
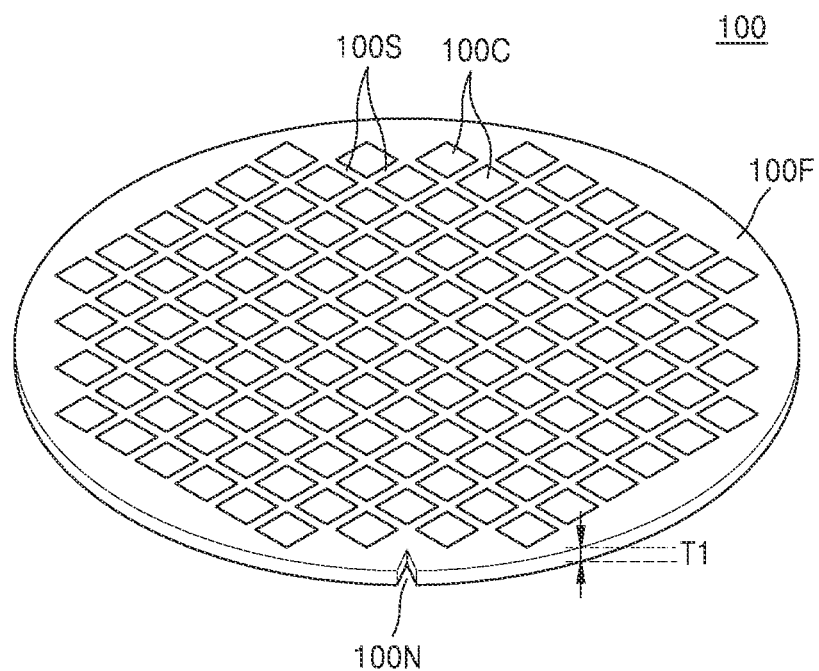
FIGS. 9 to 13 are diagrams illustrating a method of manufacturing a semiconductor package by using a dry etching apparatus, according to an example embodiment of the inventive concept.

Referring to FIG. 9, a wafer 100 including an integrated circuit area 100C and a cut area 100S is shown.

The wafer 100 may have a circular shape having a first thickness T1. The wafer 100 may include a notch 100N used as a reference point for wafer alignment.

For example, the wafer 100 may include silicon. In some embodiments, the wafer 100 may include a semiconductor element such as germanium, or a compound semiconductor such as silicon carbide (SiC), gallium arsenide (GaAs), indium arsenide (InAs), and indium phosphide (InP). In some embodiments, the wafer 100 may have a silicon on insulator (SOI) structure. In some embodiments, the wafer 100 may include an impurity-doped well or an impurity-doped structure that is a conductive area. In addition, the wafer 100 may have various device isolation structures such as a shallow trench isolation (STI) structure.

Here, it is assumed that the wafer 100 has a diameter of about 12 inches, and a case in which a silicon (Si) wafer is used is described. However, a person skilled in the art will understand that the wafer 100 having a smaller or larger diameter may be used, and that the wafer 100 including a material other than silicon may be used. In addition, the wafer 100 may have the first thickness T1 of about 0.1 mm to about 1 mm. When the first thickness T1 of the wafer 100 is too small, mechanical strength may be insufficient, and when the first thickness T1 is too large, a time required for a subsequent etching process may be increased, thereby reducing productivity of a semiconductor chip 1020 (see FIG. 13).

The wafer 100 may include an active surface 100F, which is a front-side surface and an inactive surface 100B, which is a back-side surface. A plurality of integrated circuit areas 100C that are to be separated from each other later to become the semiconductor chip 1020 (see FIG. 13) may be provided on the active surface 100F.

The semiconductor chip 1020 (see FIG. 13) may be roughly divided into a memory chip and a logic chip. The memory chip may include a volatile memory device or a non-volatile memory device. For example, the volatile memory device may include an existing volatile memory device such as a dynamic random access memory (RAM) (DRAM), a static RAM (SRAM), a thyristor RAM (TRAM), a zero capacitor RAM (ZRAM), or a twin transistor RAM (TTRAM) and a volatile memory device currently being developed. In addition, the non-volatile memory device may include, for example, an existing non-volatile memory device such as a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano floating gate memory, a holographic memory, a molecular electronics memory, or an insulator resistance change memory, and a non-volatile memory device currently being developed.

For example, the logic chip may be implemented as a microprocessor, a graphics processor, a signal processor, a network processor, an audio codec, a video codec, an application processor, or a system on chip, but embodiments are not limited thereto. The microprocessor may include, for example, a single core or a multi-core.

A trim width of the edge portion of the wafer 100 may be determined according to a type of the semiconductor device provided on the wafer 100.

The plurality of integrated circuit areas 100C may be arranged to be isolated from each other by the cut area 100S. The cut area 100S may be referred to as a scribe line. In other words, the plurality of integrated circuit areas 100C may be surrounded in all directions by the cut area 100S and arranged to be spaced apart from each other. As the wafer 100 and various types of material layers provided on the wafer 100 are cut by a cutting process performed along the cut area 100S, the plurality of integrated circuit areas 100C may be separated from each other into the plurality of semiconductor chips 1020 (see FIG. 13).

Figure 10:
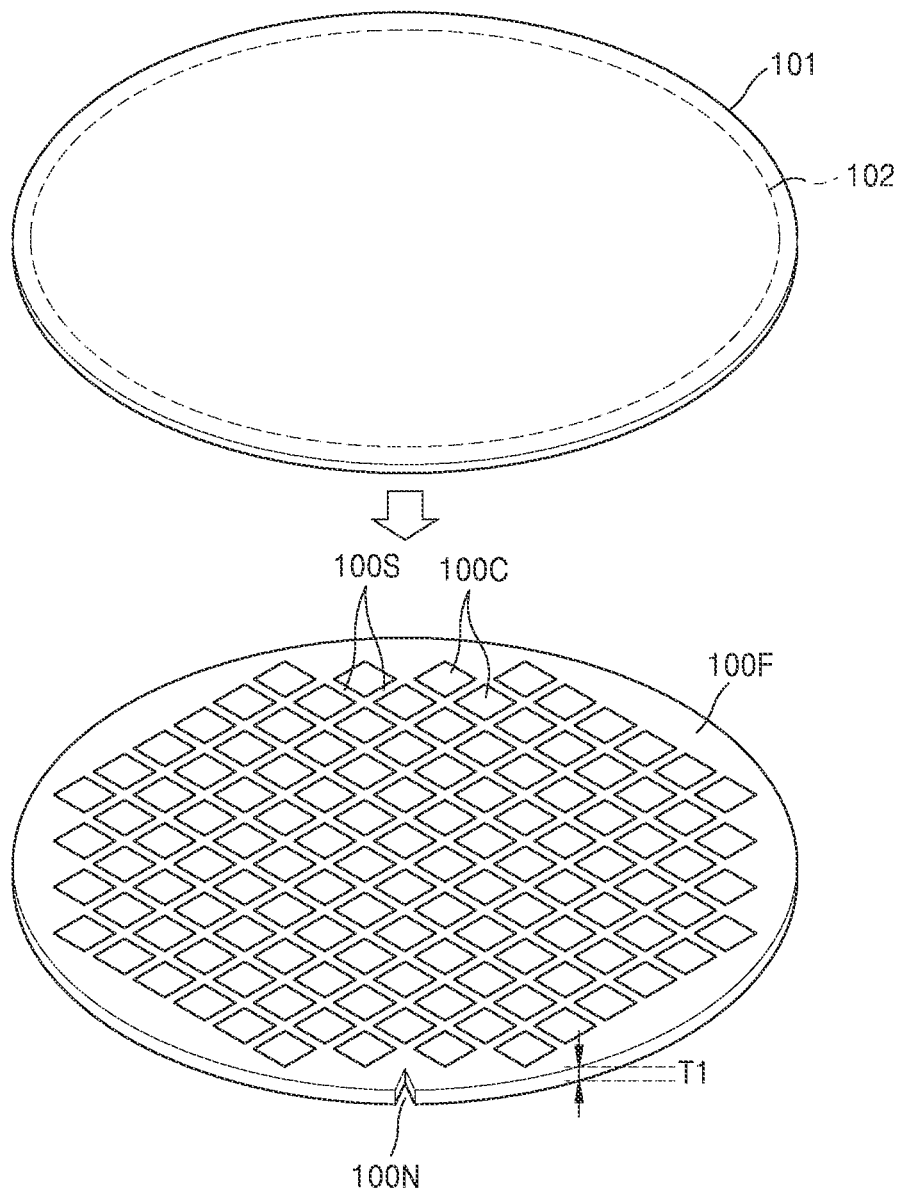

Referring to FIG. 10, a carrier substrate 101 may be adhered onto the active surface 100F of the wafer 100.

For example, the carrier substrate 101 may include glass, silicon, or aluminum oxide. In order to facilitate attachment of the wafer 100 to the carrier substrate 101, a protective sheet 102 may be provided as an adhesive layer between the carrier substrate 101 and the wafer 100.

The protective sheet 102 may protect the integrated circuit area 100C during an etching process of the wafer 100. For example, the protective sheet 102 may include a polyvinylchloride (PVC)-based polymer sheet, and may be attached onto the active surface 100F by an acrylic resin-based adhesive. The acrylic resin-based adhesive may have a thickness of about 2 μm to about 10 μm, and the protective sheet 102 may have a thickness of about 60 μm to about 200 μm. The protective sheet 102 may have a circular shape having a diameter substantially equal to that of the wafer 100.

Referring to FIG. 11, a process of manufacturing a semiconductor device provided on the wafer 100 is as follows.

First, a front-end-of-line (FEOL) structure 130 including a plurality of individual devices 132 and an interlayer insulating layer 134 may be provided on the active surface 100F of the wafer 100, and a via hole 110H may be provided by etching the interlayer insulating layer 134 and part of the wafer 100.

An anisotropic etching process or a laser drilling technique may be used to form the via hole 110H. For example, the via hole 110H may be provided to have a width of about 10 μm or less in the wafer 100. For example, the via hole 110H may be provided to have a depth of about 50 μm to about 100 μm from an upper surface of the interlayer insulating layer 134. However, the width and depth of the via hole 110H are not limited thereto.

Next, a via insulating layer 120 covering inner side walls and a bottom surface of the via hole 110H may be provided. The via insulating layer 120 may be provided to cover a surface of the wafer 100 exposed inside the via insulating layer 120 and a surface of the interlayer insulating layer 134.

Next, a conductive barrier layer 114 may be provided on the via hole 110H inside and outside of the via hole 110H. A physical vapor deposition (PVD) process or a chemical vapor deposition (CVD) process may be used to form the conductive barrier layer 114. For example, the conductive barrier layer 114 may include a single layer including one type of material or layers including at least two types of materials. For example, the conductive barrier layer 114 may include at least one material selected from among tungsten (W), tungsten nitride (WN), tungsten carbide (WC), titanium (Ti), titanium nitride (TiN), tantalum nitride (TaN), ruthenium (Ru), cobalt (Co), manganese (Mn), tungsten nitride (WN), nickel (Ni), and nickel boride (NiB). For example, the conductive barrier layer 114 may have a stacked structure of a TaN layer having a thickness of about 50 Å to about 200 Å and a Ta layer having a thickness of about 1000 Å to about 3000 Å.

Next, a conductive plug 112 filling a remaining space of the via hole 110H may be provided on the conductive barrier layer 114. A process of forming the conductive plug 112 may be performed after a process of forming the conductive barrier layer 114 while maintaining a vacuum atmosphere at the time of forming the conductive barrier layer 114 without destroying the vacuum atmosphere. The conductive plug 112 may be provided to cover the conductive barrier layer 114 inside and outside of the via hole 110H.

For example, an electroplating process may be used to form the conductive plug 112. For example, first, a metal seed layer (not shown) may be provided on a surface of the conductive barrier layer 114, and then a metal layer may be grown from the metal seed layer by an electroplating process to form the conductive plug 112 filling the via hole 110H on the conductive barrier layer 114. The metal seed layer may include copper (Cu), a Cu alloy, Co, Ni, Ru, Co/Cu, or Ru/Cu. A PVD process may be used to form the metal seed layer.

The conductive plug 112 may include Cu or W. For example, the conductive plug 112 may include Cu, copper-tin (CuSn), copper-magnesium (CuMg), copper-nickel (CuNi), copper-zinc (CuZn), copper-palladium (CuPd), copper-gold (CuAu), copper-rhenium (CuRe), copper-tungsten (CuW), W, or a W alloy, but embodiments are not limited thereto. The electroplating process may be performed at a temperature of about 10° C. to about 65° C., respectively. For example, each of the electroplating processes may be performed at room temperature. After the conductive plug 112 is formed, if necessary, a resultant product on which the conductive plug 112 is formed may be annealed at a temperature of about 150° C. to about 450° C.

Next, a resultant product in which the conductive plug 112 is formed in the via hole 110H may be heat-treated. As a result, metal particles included in the conductive plug 112 may grow due to heat treatment, so that roughness on an exposed surface of the conductive plug 112 may be alleviated. For example, the heat treatment may be performed at a temperature of about 400° C. to about 600° C.

Next, from among the metal particles grown by the heat treatment, portions protruding to the outside of the via hole 110H may be removed by a chemical mechanical polishing (CMP). A through-electrode 110 including the conductive plug 112 and the conductive barrier layer 114 surrounding the conductive plug 112 may remain in the via hole 110H. Although only one through-electrode 110 is illustrated in the drawings for convenience of explanation, the through-electrode 110 may be provided in plurality.

Next, after cleaning the resultant including the through-electrode 110, a multi-layer line structure 146 in which a plurality of metal line layers 142 and a plurality of via plugs 144 are alternately connected one by one, and a bonding pad 152 connected to the multi-layer line structure 146 may be provided on the interlayer insulating layer 134.

In some embodiments, each of the plurality of metal line layers 142 and the plurality of via plugs 144 may include at least one metal selected from among W, aluminum (Al), and Cu. The plurality of metal line layers 142 and the plurality of via plugs 144 may include the same material. Alternatively, at least some of the plurality of metal line layers 142 and the plurality of via plugs 144 may include different materials from each other.

Next, on the FEOL structure 130, a back-end-of-line (BEOL) structure 140 including a metal interlayer insulating layer 148 and a plurality of multi-layer line structures including a portion insulated by the metal interlayer insulating layer 148 may be provided. The BEOL structure 140 may include a plurality of line structures for connecting the plurality of individual devices 132 included in the FEOL structure 130 to other lines provided on the wafer 100. The BEOL structure 140 may further include a seal ring for protecting the line structures and other structures thereunder from external impact or moisture.

Next, after an upper insulating layer 150 having a hole 150H exposing the bonding pad 152 is provided on the BEOL structure 140, a connection terminal 154 connected to the bonding pad 152 through the hole 150H may be provided on the upper insulating layer 150. In some embodiments, the upper insulating layer 150 may include silicon oxide, silicon nitride, a polymer, or any combinations thereof.

As described above, the carrier substrate 101 and the protective sheet 102 may be attached to the wafer 100 on which the semiconductor device manufacturing process is performed.

Referring to FIG. 12, the inactive surface 100B of the wafer 100 may be partially removed by using the dry etching apparatus 10 according to the inventive concept.

When the dry etching apparatus 10 (see FIG. 1) according to the inventive concept is used, defects such as damage to the edge portion of the wafer 100 due to excessive plasma and defects such as bending of the through-electrode 110 may be effectively resolved by adjusting a distance between the edge ring 210 (see FIG. 1) and the shadow ring 220 (see FIG. 1) in the wafer support unit 200 (see FIG. 1).

By using the dry etching apparatus 10 (see FIG. 1) according to the inventive concept, a first step of loading the wafer 100 into the process chamber CB (see FIG. 1), a second step of seating the wafer 100 on the edge ring 210 (see FIG. 1), a third step of transferring the horizontal distance HG (see FIG. 2) between the wafer 100 and the edge ring 210 (see FIG. 1) to the distance control unit 700 (see FIG. 5), a fourth step of positioning the shadow ring 220 (see FIG. 1) to be spaced apart by the first vertical distance VG (see FIG. 4) on the edge ring 210, a sixth step of dry etching the wafer 100 by using the plasma PS, a sixth step of raising the shadow ring 220 (see FIG. 1), and a seventh step of unloading the wafer 100 to the outside of the process chamber CB (see FIG. 1) may be performed.

In the dry etching method S30 (see FIG. 8) according to the inventive concept, by partially removing the inactive surface 100B of the wafer 100, the through-electrode 110 surrounded by the via insulating layer 120 may protrude from the inactive surface 100B of the wafer 100.

In addition, in the dry etching method S30, a thickness of the wafer 100 may be changed from the first thickness T1 before the dry etching process to the second thickness T2 after the dry etching process, and data about the first thickness T1 and the second thickness T2 may be stored in the memory unit 702 (see FIG. 5).

Figure 13:
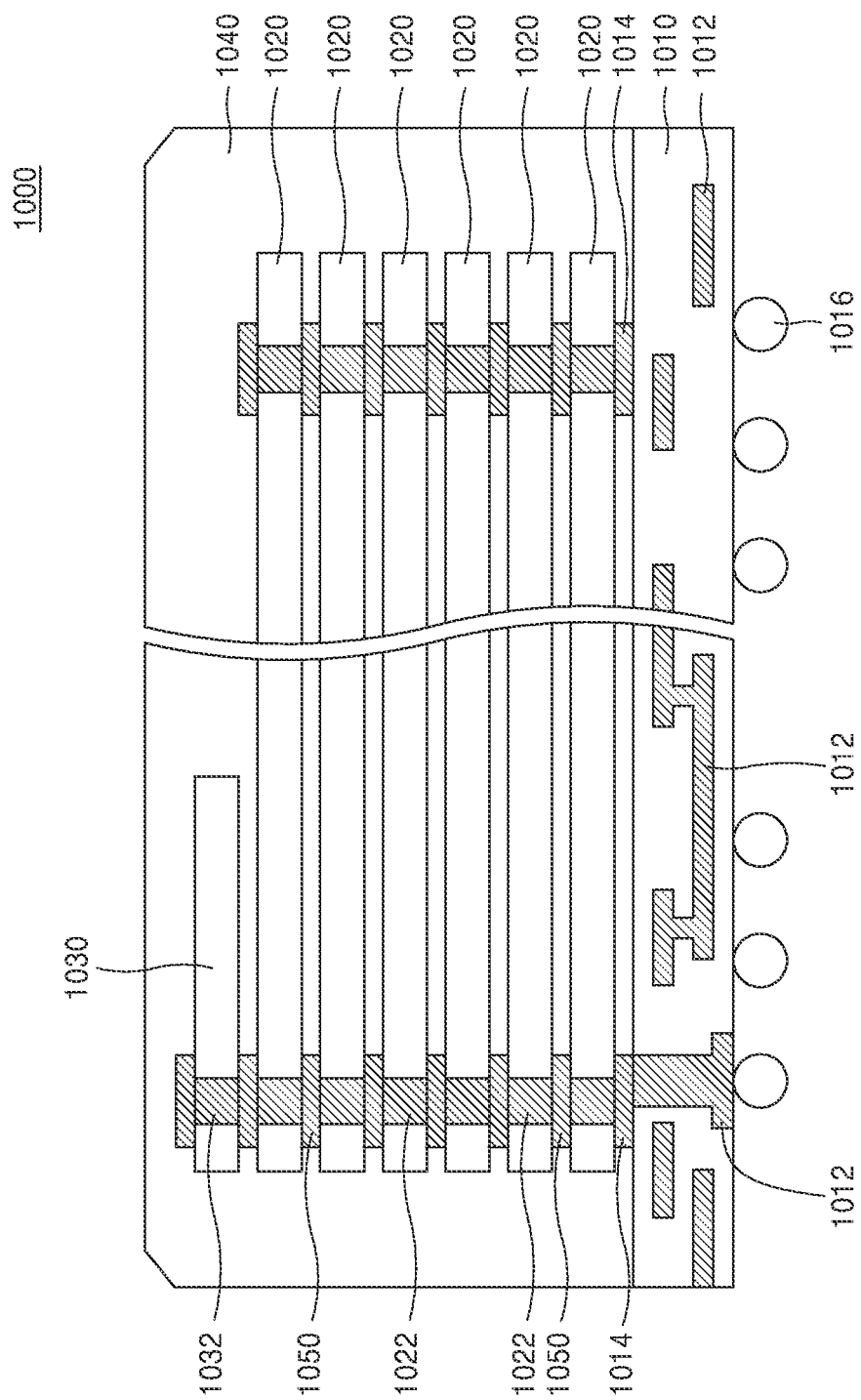

Referring to FIG. 13, a semiconductor package 1000 may include a plurality of semiconductor chips 1020 sequentially stacked on a package substrate 1010.

The plurality of integrated circuit areas 100C on the wafer 100 may be physically separated from each other by the cut area 100S to manufacture the semiconductor chip 1020. The semiconductor package 1000 may be manufactured by using the semiconductor chip 1020 manufactured as described above.

A control chip 1030 may be connected to the plurality of semiconductor chips 1020. A stacked structure of the plurality of semiconductor chips 1020 and the control chip 1030 may be sealed on the package substrate 1010 with a sealing member 1040 such as a thermosetting resin.

Although FIG. 13 shows a structure in which six semiconductor chips 1020 are vertically stacked, the number or stacking direction of the semiconductor chips 1020 are not limited thereto. The number of semiconductor chips 1020 may be determined to be fewer or greater as needed. The plurality of semiconductor chips 1020 may be arranged in a horizontal direction on the package substrate 1010 or may be arranged in a connection structure in which vertical mounting and horizontal mounting are combined with each other. In some embodiments, the control chip 1030 may be omitted.

The package substrate 1010 may include a flexible printed circuit board, a rigid printed circuit board, or a combination thereof. The package substrate 1010 may include a substrate internal line 1012 and a connection terminal 1014. The connection terminal 1014 may be provided on one surface of the package substrate 1010.

A solder ball 1016 may be provided on the other surface of the package substrate 1010. The connection terminal 1014 may be electrically connected to the solder ball 1016 through the substrate internal line 1012. In some embodiments, the solder ball 1016 may be replaced with conductive bumps or lead grid arrays (LGAs).

The plurality of semiconductor chips 1020 and the control chip 1030 may include through-electrodes 1022 and 1032, respectively. The through-electrodes 1022 and 1032 may be electrically connected to the connection terminal 1014 of the package substrate 1010 by a connection member 1050 such as a bump. In some embodiments, the through-electrode may be omitted from the control chip 1030.

The plurality of semiconductor chips 1020 and the semiconductor package 1000 including the plurality of semiconductor chips 1020 may be manufactured by using the dry etching method S30 (see FIG. 8) according to the inventive concept. In this case, defects such as damage to the edge portion of the wafer 100 (see FIG. 9) by excessive plasma and bending of the through-electrodes 1022 and 1032 may be effectively resolved.

While the inventive concept has been particularly shown and described with reference to embodiments thereof, it will be understood that various changes in form and details may be made therein without departing from the spirit and scope of the following claims.

What is claimed is:

1. A dry etching apparatus comprising:
 a plasma process chamber;
 an edge ring which is arranged in the plasma process chamber and on which a wafer is mounted;
 a shadow ring positioned to be spaced apart by a first vertical distance on the edge ring during a plasma etching process of the wafer;
 an operation unit coupled to the shadow ring and having a lift pin that raises and lowers the shadow ring;
 a fixing portion having a plurality of fixing pins, each of the plurality of fixing pins configured to move between an operating position in which the fixing pin is engaged with the lift pin at a respectively different position to fix a lowering point of the shadow ring and a standby position in which the fixing pin is spaced apart from the lift pin; and
 a distance control unit configured to control the fixing portion to determine the first vertical distance and to adjust the first vertical distance by selecting any of the plurality of fixing pins,
 wherein the first vertical distance is determined by a first horizontal distance between the wafer and the edge ring.

2. The dry etching apparatus of claim 1,
 wherein the first horizontal distance is determined according to a trim width of an edge portion of the wafer, and
 wherein the first horizontal distance is from about 150 μm to about 1000 μm.

3. The dry etching apparatus of claim 2,
 wherein the first vertical distance is directly proportional to the first horizontal distance, and
 wherein the first vertical distance is from about 0.1 mm to about 11 mm.

4. The dry etching apparatus of claim 2,
 wherein the trim width is determined according to a type of a semiconductor device provided on the wafer, and
 wherein information about the trim width according to the type of the semiconductor device is transferred to the distance control unit before the plasma etching process of the wafer is performed.

5. The dry etching apparatus of claim 4, wherein the distance control unit is further configured to:
 analyze the first horizontal distance according to the information transferred to the distance control unit about the trim width.

6. The dry etching apparatus of claim 1, wherein the distance control unit further comprises a memory unit configured to store data about a first thickness before an etching process of the wafer is performed and a second thickness after the etching process of the wafer is performed.

7. The dry etching apparatus of claim 6, wherein the distance control unit is further configured to generate feedback information about the etching process of the wafer according to the first thickness and the second thickness.

8. The dry etching apparatus of claim 1,
 wherein, in the plasma etching process of the wafer, an edge portion of the wafer is etched at a first etching rate, and
 wherein the first etching rate is directly proportional to the first horizontal distance.

9. The dry etching apparatus of claim 8, wherein the distance control unit is further configured to increase the first vertical distance in order to reduce the first etching rate.

10. The dry etching apparatus of claim 1, wherein each of the edge ring and the shadow ring includes an insulating material.

11. A wafer etching system comprising:
 an edge ring on which a wafer is mounted;
 a shadow ring positioned on an upper portion of the edge ring;
 an operation unit having a lift pin that raises and lowers the shadow ring;
 a fixing portion having a plurality of fixing pins, each of the plurality of fixing pins configured to move be ag post ion in which the fixing pin is engaged with the lift pin at a respectively different position to fix a lowering point of the shadow ring and a standby position n which the fixing pin is spaced apart from the lift pin; and
 a distance control unit configured to control the fixing portion to adjust the lowering point of the shadow ring and to adjust a first vertical distance by selecting any of the plurality of fixing pins,
 wherein the distance control unit determines the first vertical distance between the edge ring and the shadow ring according to a first horizontal distance between the wafer and the edge ring.

12. The wafer etching system of claim 11,
 wherein, in an etching process of the wafer, an edge portion of the wafer is etched at a first etching rate, and
 wherein as the first horizontal distance increases, the first etching rate increases.

13. The wafer etching system of claim 12,
 wherein the first vertical distance is increased in order to relatively reduce the first etching rate, or wherein the first vertical distance is reduced in order to relatively increase the first etching rate.

14. The wafer etching system of claim 13, wherein the distance control unit is further configured to control the fixing portion to adjust the first etching rate according to information about the first horizontal distance.

15. The wafer etching system of claim 11, wherein the distance control unit is further configured to generate feedback information about an etching process of the wafer, and apply the generated feedback information to a subsequent etching process.

16. A wafer etching method comprising:
loading a wafer into a process chamber which is arranged in the process chamber and on which the wafer is mounted;
mounting the wafer on an edge ring;
transferring a first horizontal distance between the wafer and the edge ring to a distance control unit;
positioning a shadow ring to be spaced apart by a first vertical distance on an upper portion of the edge ring;
dry etching the wafer by using plasma;
raising the shadow ring by using an operation unit that is coupled to the shadow ring and has a lift pin that raises and lowers the shadow ring; and
unloading the wafer to an outside of the process chamber,
wherein the first vertical distance is determined by the first horizontal distance,
wherein the raising the shadow ring comprises,
adjusting the first vertical distance by selecting one of a plurality of fixing pins included in a fixing portion, and
moving the one of the plurality of fixing pins from a standby position in which the one of the plurality of fixing pins is spaced apart from the lift pin to an operating position in which the one of the plurality of fixing pins is engaged with the lift pin at a position to fix a lowering point of the shadow ring.

17. The wafer etching method of claim 16, wherein the dry etching of the wafer by using the plasma comprises dry etching a whole surface of an inactive surface of the wafer to expose a portion of each of a plurality of through-electrodes included in the wafer.

18. The wafer etching method of claim 16, wherein, in the dry etching of the wafer by using the plasma, overetching of an edge portion of the wafer is suppressed by the shadow ring.

19. The wafer etching method of claim 16, wherein the positioning of the shadow ring to be spaced apart by the first vertical distance on the upper portion the edge ring comprises determining the first vertical distance by selecting, by the distance control unit, any of a plurality of fixing pins according to the first horizontal distance.

20. The wafer etching method of claim 19, wherein the distance control unit generates feedback information about a first thickness of the wafer before an etching process is performed and a second thickness of the wafer after the etching process is performed to reset the first horizontal distance in a subsequent etching process.

* * * * *